United States Patent
Cai et al.

(10) Patent No.: US 9,379,209 B2
(45) Date of Patent: Jun. 28, 2016

(54) SELECTIVELY FORMING A PROTECTIVE CONDUCTIVE CAP ON A METAL GATE ELECTRODE

(71) Applicant: GLOBALFOUNDRIES Inc., Grand Cayman (KY)

(72) Inventors: Xiuyu Cai, Niskayuna, NY (US); Jiajun Mao, Albany, NY (US); Xusheng Wu, Ballston Lake, NY (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/536,167

(22) Filed: Nov. 7, 2014

(65) Prior Publication Data

US 2016/0133721 A1 May 12, 2016

(51) Int. Cl.
| | |
|---|---|
| H01L 29/66 | (2006.01) |
| H01L 21/28 | (2006.01) |
| H01L 21/285 | (2006.01) |
| H01L 21/321 | (2006.01) |
| H01L 21/3205 | (2006.01) |

(52) U.S. Cl.
CPC .... H01L 29/66545 (2013.01); H01L 21/28079 (2013.01); H01L 21/28562 (2013.01); H01L 21/32053 (2013.01); H01L 21/32115 (2013.01)

(58) Field of Classification Search
None
See application file for complete search history.

(56) References Cited

U.S. PATENT DOCUMENTS

| | | | |
|---|---|---|---|
| 7,985,669 B2 | 7/2011 | Huotari et al. | |
| 2007/0152252 A1* | 7/2007 | Buehler | H01L 21/02074 257/295 |
| 2008/0087966 A1* | 4/2008 | Tai | H01L 21/823842 257/369 |
| 2010/0136776 A1* | 6/2010 | Huotari | H01L 29/66583 438/585 |
| 2012/0126295 A1* | 5/2012 | Edge | H01L 21/823807 257/288 |
| 2013/0009257 A1* | 1/2013 | Ando | H01L 21/28088 257/411 |
| 2015/0137273 A1* | 5/2015 | Zhang | H01L 29/66545 257/412 |

OTHER PUBLICATIONS

Wacaser et al., "Growth System, Structure, and Doping of Aluminum-Seeded Epitaxial Silicon Nanowires," NANO Letters, 9:3296-3301, 2009.*

* cited by examiner

Primary Examiner — Ha Tran T Nguyen
Assistant Examiner — Jordan Klein
(74) Attorney, Agent, or Firm — Amerson Law Firm, PLLC (57) ABSTRACT

A replacement gate structure that includes a conductive metal gate electrode is formed in a gate cavity, wherein the gate cavity is formed in a dielectric material formed above an active region of a semiconductor device. An upper surface of the conductive metal gate electrode and an upper surface of the dielectric material are planarized during a common planarization process, and a protective conductive cap is selectively formed on and in direct physical contact with the planarized upper surface of the conductive metal gate electrode. A contact structure is formed in a dielectric insulating layer formed above the replacement gate structure, the contact structure directly contacting the protective conductive cap.

25 Claims, 8 Drawing Sheets

SELECTIVELY FORMING A PROTECTIVE CONDUCTIVE CAP ON A METAL GATE ELECTRODE

BACKGROUND OF THE INVENTION

1. Field of the Invention

The present disclosure generally relates to the fabrication of semiconductor devices, and, more particularly, to methods for selectively forming a protective conductive cap on a metal gate electrode and devices resulting from the same.

2. Description of the Related Art

In modern integrated circuits, such as microprocessors, storage devices and the like, a large number of circuit elements, especially transistors, are provided on a restricted chip area. Immense progress has been made with respect to increased performance and reduced feature sizes of circuit elements; however, the ongoing demand for enhanced functionality of electronic devices forces semiconductor manufacturers to steadily reduce the dimensions of the circuit elements as well as increase their operating speed. Such continuous scaling of feature sizes involves great efforts in redesigning process techniques and developing new process strategies and tools.

For many device technology generations, the gate structures of most transistor elements have been based on the use of silicon and silicon-based materials, such as a silicon dioxide and/or silicon oxynitride gate dielectric layer, in combination with a polysilicon gate electrode. However, as the channel length of aggressively scaled transistor elements has become increasingly smaller, many newer generation devices have turned to gate structures that make use of alternative materials in an effort to avoid the short-channel effects which may be associated with the use of traditional silicon-based materials in reduced channel length transistors. For example, gate structures that utilize a so-called high-k dielectric/metal gate ("HK/MG") configuration have been shown to provide significantly enhanced operational characteristics over the heretofore more commonly used silicon dioxide/polysilicon ("SiO/poly") configurations.

Depending on the specific overall device requirements, several different high-k materials—i.e., materials having a dielectric constant, or k-value, of approximately 10 or greater—have been used with varying degrees of success for gate structures that utilize an HK/MG material layer stack. For example, in some transistor element designs, the high-k gate dielectric material may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, a metal material layer, often referred to as a work-function adjusting material layer, may be formed on the high-k gate dielectric material so as to control the work function of the transistor. These work-function adjusting materials may include, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like. Additionally, a conductive metal gate electrode, e.g. aluminum, may be formed on the HK/MG material layer stack. The gate structure may be formed using the so-called "gate last" or "replacement gate" technique discussed below.

Figure 1A:
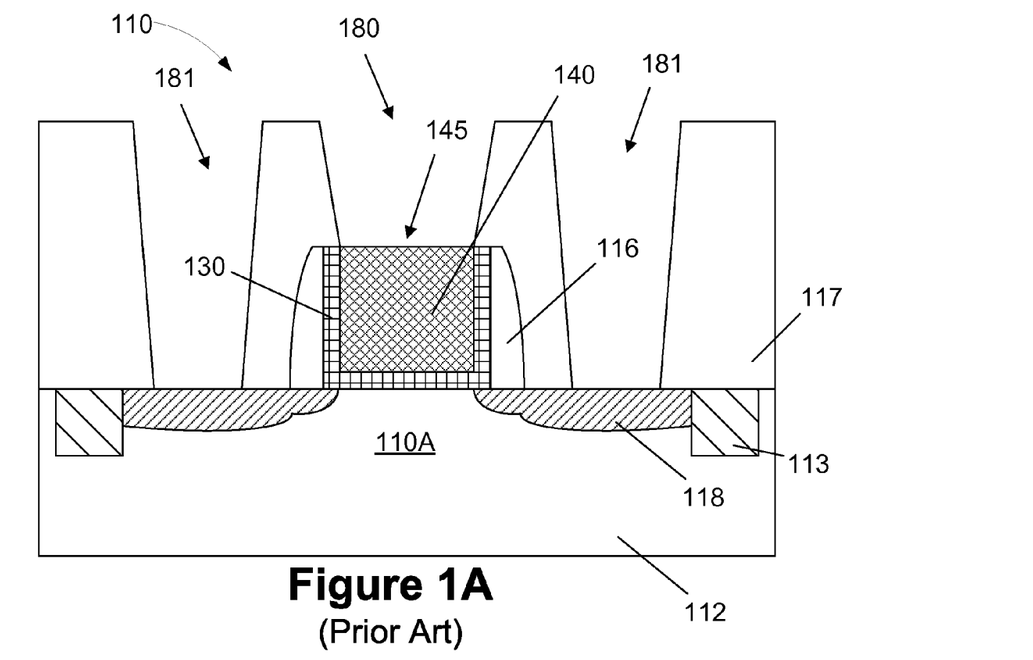
FIGS. 1A-1B depict various steps in a prior art device processing method.
Figure 1B:
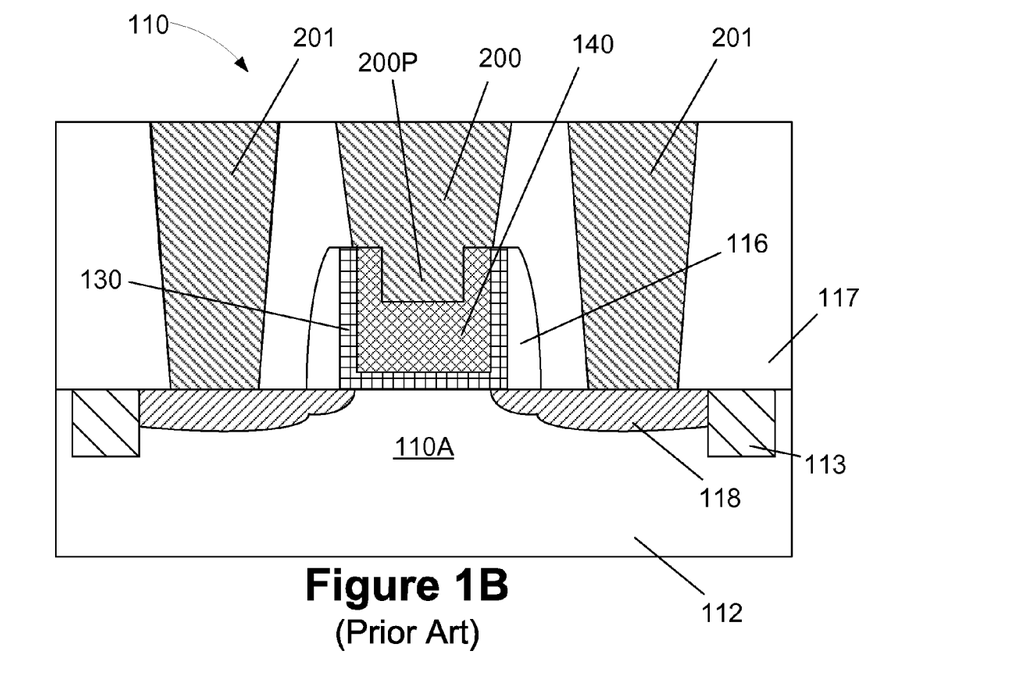

In the replacement gate technique, initial device processing steps are performed using a "dummy" gate structure. The term "dummy" gate structure refers to a process sequence wherein a gate structure that is formed during an early manufacturing stage does not ultimately form a part of the finished semiconductor device, but is instead removed and replaced with a replacement gate structure, e.g., a replacement metal gate structure, during a later manufacturing stage. However, a variety of problems can sometimes occur to a replacement metal gate structure during later device processing steps that can lead to device defects, and/or have a detrimental influence on overall device reliability. For example, when a contact structure is subsequently formed so as to provide an electrical connection to the replacement gate electrode, the material of the contact structure can sometimes enter and/or partially fill the gate cavity. In such cases, contact material could thereby have an effect on the threshold voltage ($V_t$) of the device. FIGS. 1A-1B illustrate a prior art process that can result in such a problem.

FIG. 1A illustrates a device 110 that includes a replacement metal gate structure 145 during a stage of forming contact elements to the device 110. The replacement metal gate structure 145 is formed over an active region 110A of the device 110 and includes a replacement gate electrode 140, such as an aluminum gate electrode, that is formed on and above an HK/MG material layer stack 130. Spacers 116 are formed on sidewalls of the replacement metal gate structure 145, and an interlayer dielectric material 117 covers the device 110 including the metal gate structure 145. The device 110 is formed above a semiconductor substrate 112 that includes source/drain regions 118. Isolation regions 113 are formed in the substrate 112 and define an active region 110A of the device 110. As shown in FIG. 1A, contact openings 180, 181 have been formed in the interlayer dielectric material 117 so as to expose the replacement gate electrode 140 and the source/drain regions 118, respectively.

FIG. 1B illustrates the device 110 after a conductive contact material, such as tungsten, has been formed in and above each of the openings 180, 181 and a planarization process has been performed to remove excess material from above the interlayer dielectric material 117, thereby forming a contact structure 200 in the opening 180 and contact structures 201 in the openings 181. As shown in FIG. 1B, a portion 200P of the contact structure 200 has entered and partially filled the replacement gate electrode 140. This situation sometimes occurs because the aluminum material of the replacement gate electrode 140 is vulnerable to attack during the etch/clean process that is used to form the opening 180 above the replacement gate electrode 140. Consequently, a portion of the aluminum material may be removed during the contact etch/clean process, and subsequently filled in by the material of the contact structure 200, e.g., tungsten. The presence of the material of the contact structure 200 within the replacement gate electrode 140 can cause an undesirable shift in the threshold voltage ($V_t$) of the device 110, thus degrading predictability and overall reliability of the device 110.

The present disclosure is directed to various processing methods and the resulting semiconductor devices that may be used to reduce the occurrence of, or even substantially eliminate, one or more of the problems described above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the detailed description.

Generally, the present disclosure is directed to various methods of forming a protective conductive cap on a metal gate electrode and the devices resulting from the same. One illustrative method disclosed herein includes forming a replacement gate structure that includes a conductive metal gate electrode in a gate cavity, wherein the gate cavity is formed in a dielectric material formed above an active region of a semiconductor device. Additionally, the disclosed method further includes, among other things, planarizing an upper surface of the conductive metal gate electrode and an upper surface of the dielectric material during a common planarization process and selectively forming a protective conductive cap on and in direct physical contact with the planarized upper surface of the conductive metal gate electrode. Moreover, the illustrative method also includes forming a contact structure in a dielectric insulating layer formed above the replacement gate structure, the contact structure directly contacting the protective conductive cap.

Another illustrative method disclosed herein includes lining sidewall and bottom surfaces of a gate cavity with a material layer stack that includes a high-k dielectric material and a work function metal formed above the high-k dielectric material, wherein the gate cavity is formed in a dielectric material formed above an active region of a semiconductor device. Furthermore, a conductive gate electrode material comprising aluminum is formed in the gate cavity and above the material layer stack and a planarization process is performed on the conductive gate electrode material, the material layer stack and the dielectric material so as to form a replacement gate structure that includes an aluminum gate electrode and an HK/MG material layer stack in the gate cavity. The exemplary method further includes selectively forming a protective conductive cap on and in direct physical contact with the planarized upper surface of the aluminum gate electrode, where an upper surface of the protective conductive cap is at a greater height level above the active region than the planarized upper surfaces of the HK/MG material layer stack and the dielectric material. Additionally, a contact structure is formed in a dielectric insulating layer formed above the replacement gate structure, the contact structure directly contacting the protective conductive cap and the protective conductive cap physically separating the contact structure from the aluminum gate electrode.

In yet a further exemplary embodiment of the present disclosure, a device includes a metal gate structure positioned above an active region of a semiconductor device, the metal gate structure including an HK/MG material layer stack and a conductive metal gate electrode positioned above the HK/MG material layer stack. The disclosed device further includes, among other things, a first dielectric material positioned adjacent to and surrounding the metal gate structure, wherein upper surfaces of at least the conductive metal gate electrode and the first dielectric material are substantially coplanar. Additionally, a protective conductive cap is positioned on and in direct physical contact with the upper surface of the conductive metal gate electrode, wherein an upper surface of the protective conductive cap is at a greater height level above the active region than the upper surface of the first dielectric material, and the protective conductive cap covers an entirety of the upper surface of the conductive metal gate electrode but does not cover any of the upper surface of the first dielectric material. The disclosed device further includes a second dielectric material that covers the metal gate structure and the first dielectric material, and a contact structure positioned in the second dielectric material, the contact structure directly contacting the protective conductive cap and the protective conductive cap separating the contact structure from the conductive metal gate electrode.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Additionally, unless otherwise specifically indicated herein, any relative positional or directional terms that may be used in the descriptions set forth below—such as "upper," "lower," "higher," "on," "adjacent to," "above," "below," "over," "under," "top," "bottom," "vertical," "horizontal," and the like—should be construed in light of that term's normal meaning relative to the depiction of the components or elements in the referenced figures. For example, referring to the schematic cross-section of the semiconductor device 10 depicted in FIG. 2A, it should be understood that the dummy gate electrode 19 is formed "above" the active region 10A, and that the substrate 12 is positioned "below" or "under" the layer of insulating material 17. Similarly, it should also be noted that the dummy gate cap 15 is positioned "on" the dummy gate electrode 19, whereas, in other cases, the dummy gate cap 15 may be positioned "above" the dummy gate electrode 19 in those configurations where other layers or structures are interposed therebetween.

DETAILED DESCRIPTION

Various illustrative embodiments of the invention are described below. The present disclosure generally relates to methods of forming a protective conductive cap on a metal gate electrode and the device resulting from the same. Moreover, as will be readily apparent upon a complete reading of the present application, the present method is applicable to a variety of devices including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Furthermore, the methods and devices disclosed herein may be used when forming either planar or non-planar (e.g., FinFET) transistor devices. Of course, the inventions disclosed herein should not be considered limited to the illustrative examples depicted and described herein.

FIGS. 2A-2H and FIGS. 3A-3D illustrate various processing steps that may be used to form a semiconductor device 10 in accordance with various exemplary embodiments of the present disclosure, wherein the device 10 has been depicted as a planar device for illustrative purposes only. As shown in the figures, the device 10 may be formed above an illustrative semiconductor substrate 12.

FIGS. 2A-2H depict one illustrative method of forming a protective conductive cap on a metal gate electrode and the devices resulting from the same. At the point of fabrication depicted in FIG. 2A, a semiconductor device 10 includes a semiconductor substrate 12 that may have a variety of configurations in various embodiments, such as the depicted bulk silicon configuration. The substrate 12 may also have a silicon-on-insulator ("SOI") configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

Figure 2A:
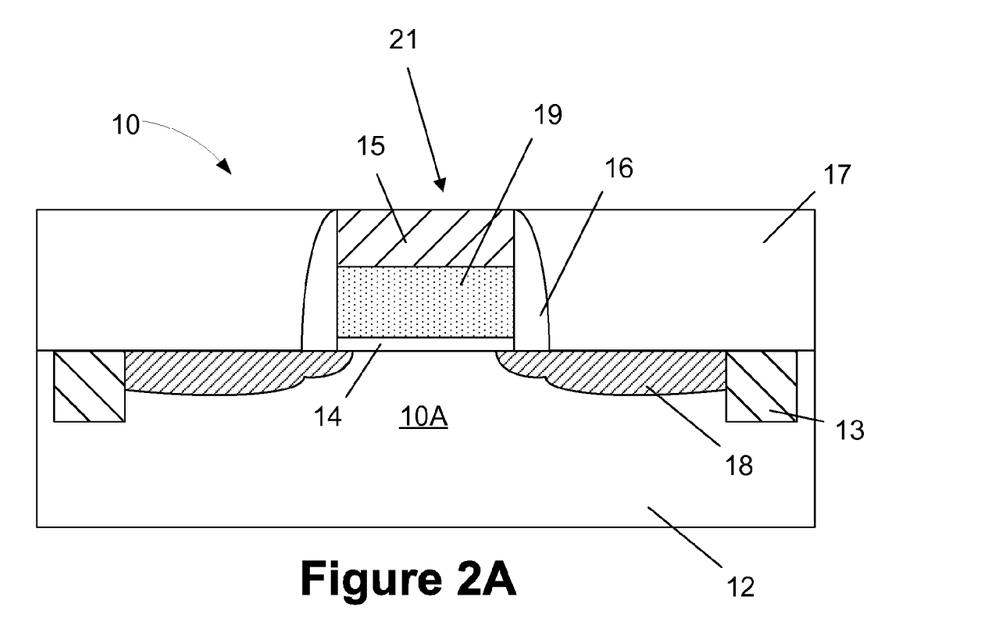
FIGS. 2A-2H depict an illustrative method of forming a protective conductive cap on a replacement metal gate electrode of an illustrative semiconductor device, and forming contact structures to the device in accordance with one exemplary embodiment disclosed herein.

As shown in FIG. 2A, isolation regions 13 have been formed in the semiconductor substrate 12 so as to define a device active region 10A, and a dummy gate structure 21 has been formed above the active region 10A. Additionally, sidewall spacers 16 have been formed on the sidewalls of the dummy gate structure 21, source/drain regions 18 have been formed in the active region 10A, and a layer of insulating material 17 has been formed above the device 10, thus isolating device 10 from adjacent semiconductor devices. The dummy gate structure 21 includes a dummy gate insulation layer 14, a dummy gate electrode 19 formed above the dummy gate insulation layer 14, and a dummy gate cap 15 formed above the dummy gate electrode 19. The various components of the device 10 may be formed by performing a variety of processes known in the art, e.g., deposition processes, patterning processes, etching processes, doping processes, etc. For example, the sidewall spacers 16 may be formed by depositing a layer of spacer material and thereafter performing an anisotropic etching process to shape the spacers 16. Also, the various components and structures of the device 10 may be formed using a variety of different materials. For example, the dummy gate insulation layer 14 may include silicon dioxide, the dummy gate electrode 19 may include polysilicon, the dummy gate cap 15 may include silicon nitride, the layer of insulating material 17 may include silicon dioxide, and the sidewall spacers 16 may include silicon oxynitride. However, it should be understood that other combinations of materials may also be used, provided, however, that the requisite etch selectivity between components for the various processing steps is provided. The source/drain regions 18 may include dopant materials (N-type dopants for NMOS devices and P-type dopants for PMOS devices), which, in some embodiments, may be implanted into the active region 10A using known masking and ion implantation techniques. The thicknesses of these various layers of material may also vary depending upon the particular application.

Figure 2B:
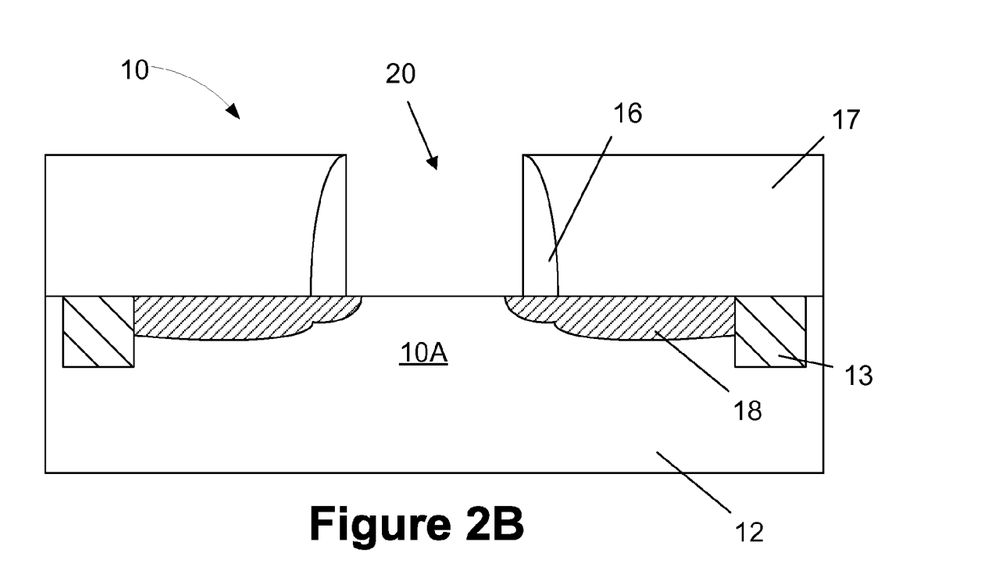

FIG. 2B illustrates the device 10 after one or more etching processes have been performed to remove the dummy gate cap 15, the dummy gate electrode 19 and the dummy gate insulation layer 14, thus defining a gate cavity 20 where a replacement gate structure will subsequently be formed. In at least one embodiment, an oxidation process may be performed so as to form an interfacial oxide layer (not shown) on the exposed semiconductor material of the active region 10A at the bottom of the gate cavity 20 in order to facilitate the further device processing.

Figure 2C:
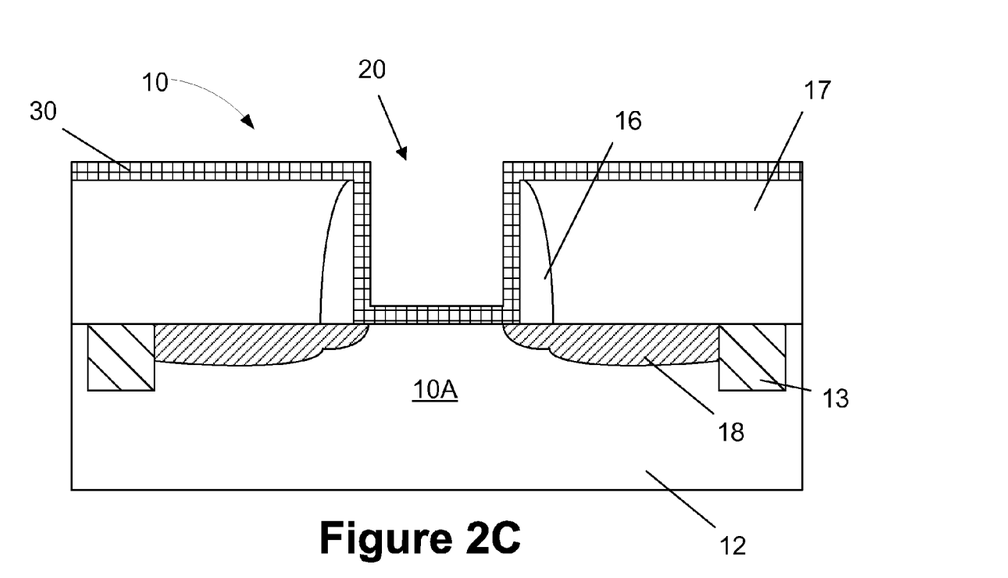

FIG. 2C illustrates the device 10 after one or more deposition processes have been performed to form a high-k dielectric/metal gate ("HK/MG") layer stack 30 within the gate cavity 20 and above the layer of insulating material 17. As discussed above, one or more different layers of high-k material may be used in the HK/MG material layer stack 30. For example, the HK/MG material layer stack 30 may include layers of tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Additionally, the HK/MG material layer stack 30 may include one or more work function metal layers above the high-k dielectric material, and the work function metal layers may include titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

In some exemplary embodiments, one or more of the various individual high-k dielectric and work function metal sub-layers that make up the HK/MG material layer stack 30 may be formed in a substantially conformal fashion, i.e., having a substantially uniform thickness, along both the bottom and sidewall surfaces of the gate cavity 20 by using a substantially conformal deposition process, such as an atomic layer deposition (ALD) process, a chemical vapor deposition (CVD) process and the like. Furthermore, in at least one embodiment, each individual layer of the HK/MG material layer stack 30 may be conformably formed such that the material layer stack 30 has a substantially uniform thickness along at least the sidewall and bottom surfaces of the gate cavity 20. In other embodiments, one or more of the various sub-layers of the HK/MG material layer stack 30 may be formed using a substantially non-conformal deposition process, such as a physical vapor deposition (PVD) or sputter process and the like, so that the thickness of the material layer stack 30 along the bottom surfaces of the gate cavity 20 may be greater than the thickness of the layer stack 30 along the sidewalls of the gate cavity 20.

Various portions of the HK/MG material layer stack 30 may then be removed during subsequent processing steps depending upon the desired process flow. In at least one embodiment (not shown), the HK/MG material layer stack 30 may be removed from above the layer of insulating material 17 and adjacent to the sidewall spacers 16 by performing one or more etching processes, leaving only a substantially horizontal portion of the HK/MG material layer stack 30 at the bottom of the gate cavity 20. In another embodiment, the HK/MG material layer stack 30 may only be removed from above the layer of insulating material 17 by performing one or more etching processes and leaving a portion of the HK/MG material layer stack 30 at the bottom and along the sidewalls of the gate cavity 20. In yet another embodiment, any excess material of the HK/MG material layer stack 30 that is formed outside the gate cavity 20 and above the layer of insulating material 17 may remain in place while a replacement gate electrode material is formed above the material layer stack 30, as described with respect to FIG. 2D below.

Figure 2D:
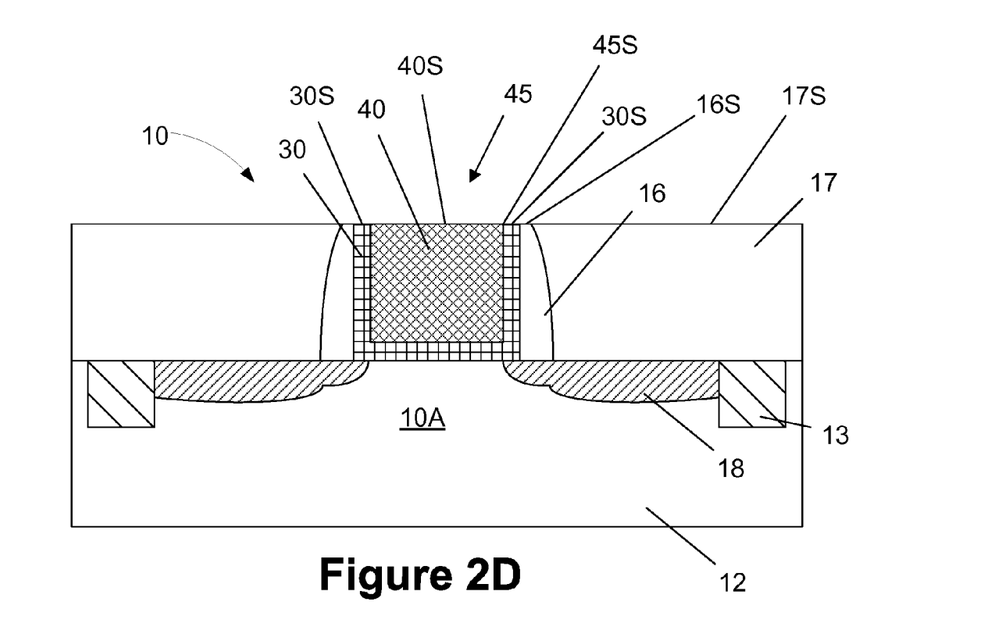

FIG. 2D illustrates the device 10 after one or more deposition and planarization processes have been performed so as to form a replacement gate electrode 40 in the gate cavity 20 and above the HK/MG material layer stack 30. In certain embodiments, a replacement gate electrode material, such as aluminum or an aluminum alloy and the like, may be deposited above the HK/MG material layer stack 30. Thereafter, one or more planarization processes, such as chemical mechanical polishing ("CMP") and/or etching processes and the like, may be performed to remove any excess replacement gate electrode material and excess portions of the HK/MG material layer stack 30 material positioned outside of the now-filled gate cavity 20 and/or above the layer of insulating material 17. After completion of the planarization process(es), a replacement gate structure 45 that includes the HK/MG material layer stack 30 and the replacement gate electrode 40 is formed in the gate cavity 20, as shown in FIG. 2D. The replacement gate electrode 40 has a planarized upper surface 40S, the HK/MG material layer stack 30 has planarized upper surfaces 30S, and the replacement gate structure 45 has an upper surface 45S that consists of the upper surface 40S in combination with the upper surfaces 30S. Furthermore, in at least some embodiments, an upper portion the sidewall spacers 16 may also be planarized during the above-described planarization process(es), and may thus also have planarized upper surfaces 16S, and the layer of insulating material 17 may also have planarized upper surfaces 17S. In certain exemplary embodiments, the upper surfaces 40S, 30S, 45S, 16S, 17S may be substantially coplanar, i.e., at substantially the same height level above the active region 10A.

Figure 2E:
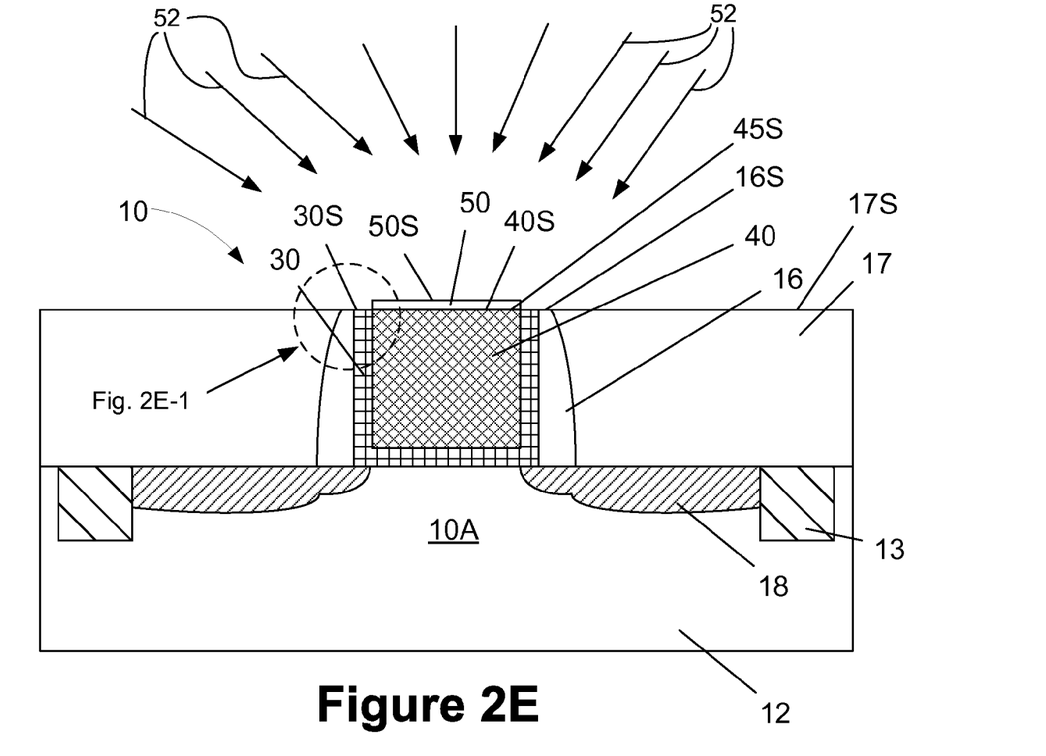

FIG. 2E illustrates the device 10 after a protective conductive cap 50 has been selectively formed above the replacement gate electrode 40. As used herein and in the appended claims, the term "selectively formed" or "selectively forming" means that the protective conductive cap 50 is formed only on selected planarized surfaces of the device shown in FIG. 2D, but not on others. For example, in some illustrative embodiments, the protective conductive cap 50 may be selectively formed by performing one or more selective material growth processes 52 so as to selectively grow the material of the conductive cap 50, such as silicon and the like, on the exposed material of the planarized upper surface 40S of the replacement gate electrode 40, such as aluminum or an aluminum-containing material and the like. As used herein and in the appended claims, the term "selective growth" or "selective material growth" means that the protective conductive cap 50 is grown in direct physical contact with the exposed upper surface 40S of the replacement gate electrode 40 by using the material of the replacement gate electrode 40 as a "seed" material to initiate growth. On the other hand, the various materials that may be positioned laterally adjacent to the replacement gate electrode 40, such as the materials of the HK/MG material layer stack 30, the sidewall spacers 16 and the layer of insulating material 17, do not act as "seed" materials, and thus growth of the protective conductive cap 50 is not initiated on these components. Therefore, in such embodiments, the protective conductive cap 50 is only grown on the exposed material of the replacement gate electrode 40, but it is not grown on any of the exposed surfaces 30S, 16S or 17S of the surrounding materials, i.e., the HK/MG material layer stack 30, the sidewall spacers 16 or the layer of insulating material 17—hence the term "selective growth."

In various other embodiments, the protective conductive cap 50 may be selectively formed by performing one or more selective material deposition processes 52 so as to selectively deposit the material of the conductive cap 50 on the exposed material of the planarized upper surface 40S of the replacement gate electrode 40. Depending upon the specific process flow and device application, the material of the selectively deposited protective conductive cap 50 may include one or more noble metals, such as ruthenium, rhodium, palladium, silver, osmium, iridium, platinum and gold, or other conductive metals such as tungsten, rhenium and the like.

As used herein and in the appended claims, the term "selective deposition" or "selective material deposition" means that the protective conductive cap 50 is deposited in direct physical contact with the exposed upper surface 40S of the replacement gate electrode 40 by using a suitable selective material deposition process, such as a vapor phase deposition process and the like. For example, in some embodiments, the vapor phase deposition process may be, e.g., a self-limiting atomic layer deposition (ALD) process, such as is described in U.S. Pat. No. 7,985,669, incorporated herein by reference in its entirety. In certain embodiments, the protective conductive cap 50 may only be deposited on and in direct physical contact with the exposed surface 40S of the replacement gate electrode 40, but not on the exposed surface 30S of the HK/MG material layer stack 30, or on the exposed surfaces of other surrounding materials, e.g., the exposed surface 16S, 17S of the sidewall spacers 16 and the layer of insulating material 17, respectively. In other embodiments, the protective conductive cap 50 may also be selectively deposited on at least some portions of the exposed surface 30S of the HK/MG layer stack 30, depending on the material compositions of the protective conductive cap 50 and the HK/MG material layer stack 30. However, in such embodiments, as with the selective growth process described above, the protective conductive cap 50 will not be formed on the exposed surfaces 16S, 17S of the surrounding materials.

In at least some embodiments of the present disclosure, such as when the material of the replacement gate electrode 40 includes aluminum or an aluminum alloy and the material of the protective conductive cap 50 includes silicon, a pregrowth anneal process may be performed on the replacement gate electrode 40 so as to facilitate the subsequent "selective growth" of the conductive cap 50 on the gate electrode 40. For example, the pregrowth anneal process may be performed for approximately 20 minutes at a temperature that is approximately equal to or greater than the aluminum/silicon (Al/Si) bulk eutectic temperature of 577° C. so as to allow the aluminum material of the replacement gate electrode 40 to agglomerate into small islands on the surface and form liquid droplets in preparation for the selective growth of the protective conductive cap 50. In certain exemplary embodiments, the pregrowth anneal process may be performed in the range of approximately 580-620° C., whereas, in at least one embodiment, the pregrowth anneal process may be performed at approximately 600° C. Additionally, the pregrowth heat treatment process may be performed in a processing chamber under substantial vacuum conditions, e.g., wherein the pressure has been reduced to approximately $1 \times 10^{-6}$ Torr or lower.

After completion of the pregrowth anneal process, the temperature of the processing chamber is reduced to a desired material growth temperature and the device 10 is then exposed to a suitable material growth ambient for selectively growing the protective conductive cap 50 on the exposed surface 40S of the replacement gate electrode 40. For example, in those embodiments wherein the replacement gate electrode 40 includes aluminum and the protective conductive cap 50 includes silicon, the material growth temperature may be lowered below the Al/Si bulk eutectic temperature, such as in the range of approximately 500-540° C., and a material growth ambient containing silane ($SiH_4$) may then be introduced into the deposition chamber. Additionally, the pressure in the processing chamber may be raised above the substantial vacuum conditions noted previously, but still may remain relatively low, such as at approximately 200 mTorr and the like, such that the total pressure in the processing chamber is substantially the same as the partial pressure of the silane portion of the material growth ambient.

Additional description of the exemplary selective material growth process described above may be found in "Growth System, Structure, and Doping of Aluminum-Seeded Epitaxial Silicon Nanowires" by Brent A. Wacaser et al., published by the American Chemical Society in *Nano Letters*, Vol. 9, No. 9, 2009, herein incorporated by reference in its entirety.

Figure 2E:
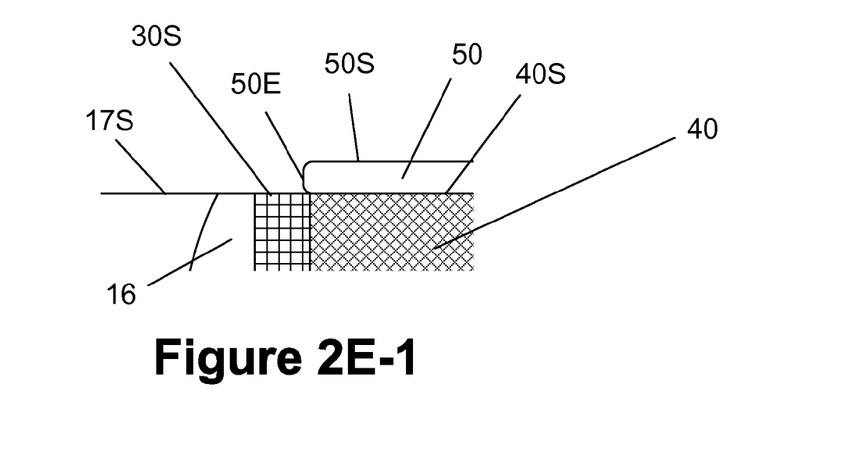
Figure 2F:
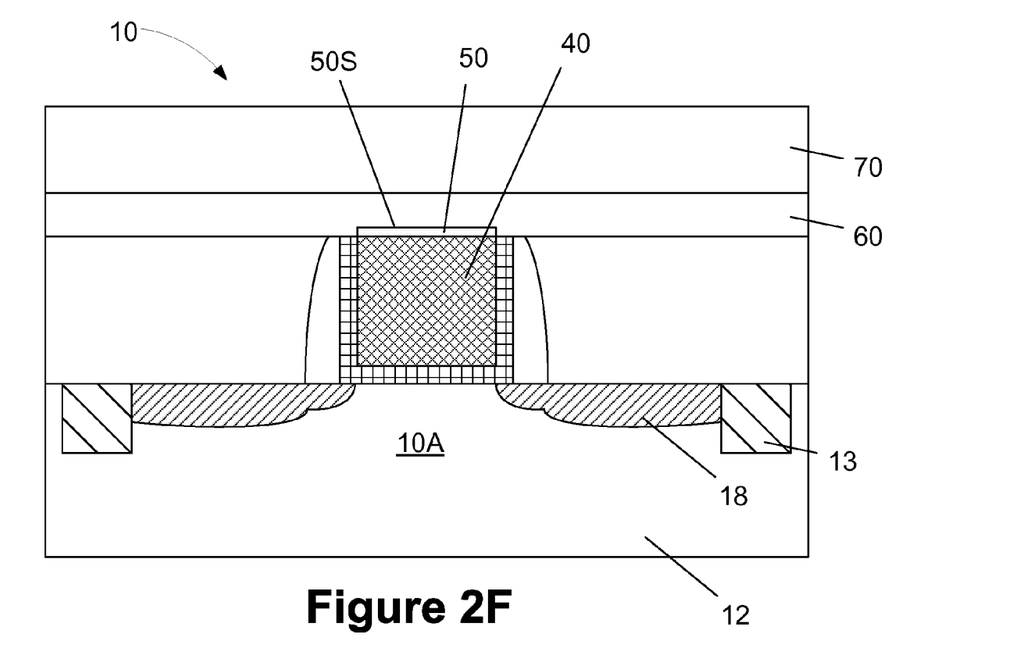

After selectively forming the protective conductive cap 50, the exposed upper surface 50S of the conductive cap 50 is at a greater height level above the active region 10A than any of the various planarized upper surfaces 40S, 30S, 45S, 16S, 17S. Of course, other materials may also be in direct physical contact with the conductive cap 50 as shown in FIG. 2F and discussed below. Furthermore, in those embodiments wherein a selective growth process 52 is used to selectively grow the protective conductive cap 50 only on the exposed surface 40S of the replacement gate electrode 40 and not on the exposed surfaces 30S, 16S, 17S of the surrounding materials, the conductive cap 50 may be formed such that a small portion 50E of the conductive cap 50 extends laterally over a portion of the exposed upper surfaces 30S of the HK/MG material layer stack 30, as shown in FIG. 2E-1. However, unlike the material of the replacement gate electrode 40, it should be understood by one of ordinary skill after a complete reading of the present disclosure that the high-k gate dielectric materials and/or work-function materials that make up the various layers of the HK/MG material layer stack 30 do not initiate any material growth during the selective material growth process 52. Instead, growth initiation of the conductive cap 50 only occurs on the material at the exposed upper surface 40S of the replacement gate electrode 40.

FIG. 2F illustrates the device 10 after several further material deposition processes have been performed. Specifically, a first insulating layer 60 of, e.g., silicon nitride has been deposited above the device 10 shown in FIG. 2E. Furthermore, a second insulating layer 70 of, e.g., silicon oxide has been deposited above the first insulating layer 60. These layers will eventually support and insulate a gate contact and source/drain contacts for the device 10. Furthermore, in certain illustrative embodiments, the first insulating layer 60 may act as an etch stop layer when a contact opening 80 is later formed to expose at least part of the conductive cap 50 formed the replacement gate electrode 40 (see FIG. 2G). In various embodiments, planarization, e.g., CMP or etch, processes may be performed to planarize each of the first and second insulating layers 60, 70 after deposition. In other embodiments, one or both of the first and second insulating layers 60, 70 may be formed using a spin-on coating process and the like, wherein the materials used to form one or both of the first and second insulating layers 60, 70 are deposited in a substantially viscous state so that the as-deposited layers may have a substantially planar upper surface.

Figure 2G:
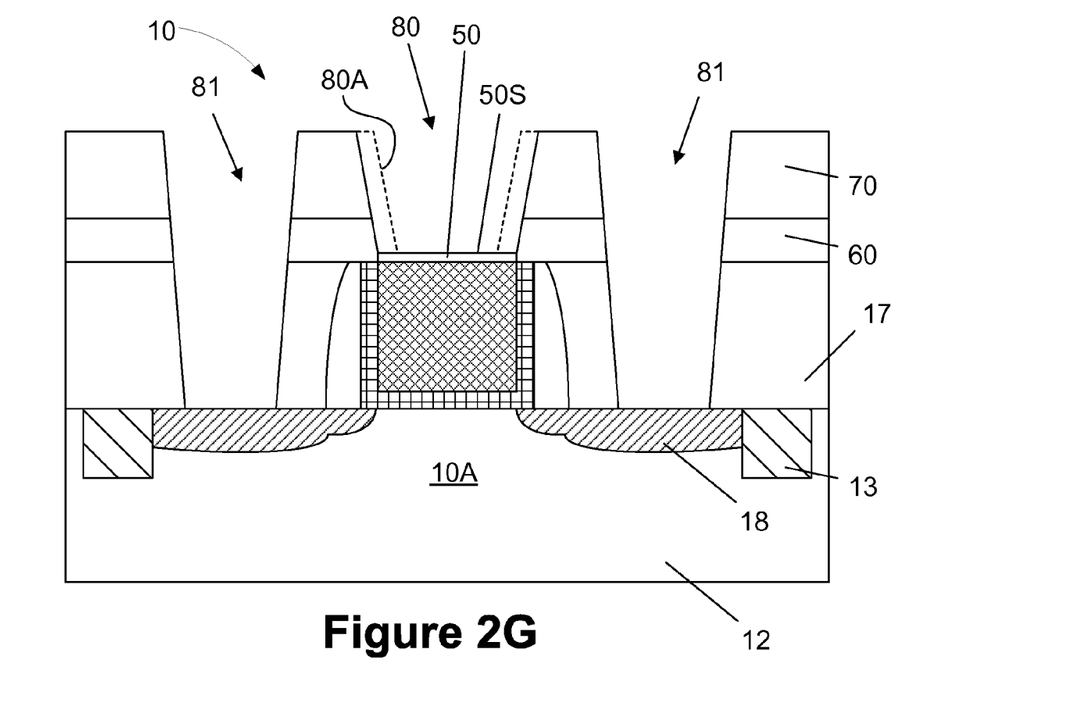

FIG. 2G illustrates the device 10 after one or more etching processes have been performed so as to form contact openings 80 and 81 to the various contact regions of the device 10. For example, as shown in FIG. 2G, the contact opening 80 is formed through the first insulating layer 60 and the second insulating layer 70 so as to expose the upper surface 50S of the conductive cap 50, and the contact openings 81 are formed through the first and second insulating layers 60, 70 and the layer of insulating material 17 so as to expose the source/drain regions 18. While the illustrative embodiment depicted in FIG. 2G shows that substantially the entire width of the conductive cap 50 may be exposed by the contact opening 80, it should be understood by those of ordinary skill after a complete reading of the present disclosure that the lateral size of the contact opening 80 may be adjusted (as indicated by the dashed lines 80A in FIG. 2G) so that only a portion of the conductive cap 50 may be exposed by the contact opening 80.

In certain embodiments, the contact openings 80 and 81 may be formed during a common etching sequence, that is, during the same etching steps and using a common etch mask (not shown). In other embodiments, the contact openings 80 and 81 may be formed during different etching sequences and using different etch masks (not shown). Furthermore, in at least one embodiment, the material of the conductive cap 50 and the source/drain regions 18 may be used as etch stops when forming the respective contact openings 80 and 81, whereas, in at least one embodiment, a separate etch stop layer (not shown) may be formed above the respective contact regions.

Figure 2H:
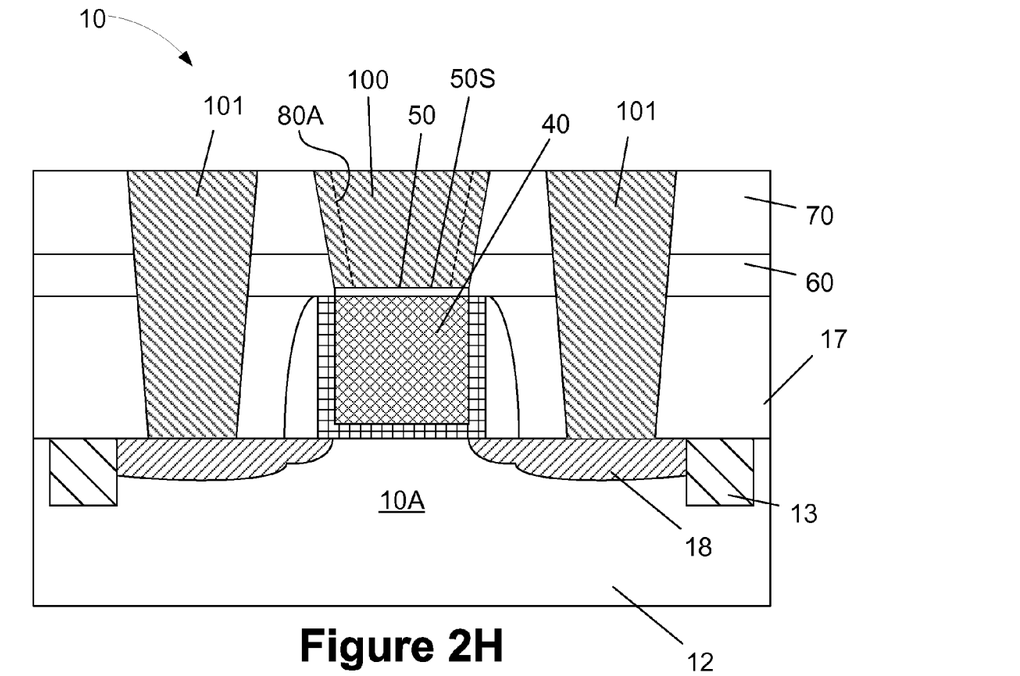

FIG. 2H illustrates the device 10 after several further processing steps have been performed. For example, a conductive contact material for the conductive contact structures 100 and 101 has been formed in the respective contact openings 80 and 81 by performing one or more deposition processes. Furthermore, a planarization process, such as a CMP and/or etching process and the like, has also been performed to planarize the contact structures 100, 101 and remove any excess conductive contact material that may have been formed outside of the contact openings 80, 81 and/or above the second insulating layer 70. In at least one embodiment, one or both of the contact structures 100, 101 may include tungsten, whereas, in other illustrative embodiments, at least one of the contact structures 100, 101 may include other conductive materials, such as cobalt, copper, silver and the like. Moreover, the contact structures 100 and 101 depicted in FIG. 2H may have any desired shape, size or configuration, such as circular, square, rectangular, octagonal and the like, depending upon the specific application.

As depicted in FIG. 2H, the contact structures 101 are formed in the contact openings 81 and are electrically coupled to the source/drain regions 18, and the contact structure 100 is formed in the contact opening 80 and is electrically coupled to the replacement gate electrode 40 through the conductive cap 50. In at least one embodiment, the contact structure 100 is formed above the replacement gate electrode 40 during a different material deposition sequence than when the contact structures 101 are formed above the source/drain regions 18, i.e., either before or after. Furthermore, in such embodiments, the contact structures 100 and 101 may contain either the same or different conductive materials. In other exemplary embodiments, the contact structures 100 and 101 may be formed during a common material deposition sequence, i.e., at the same time, from the same conductive material or materials.

Figure 3A:
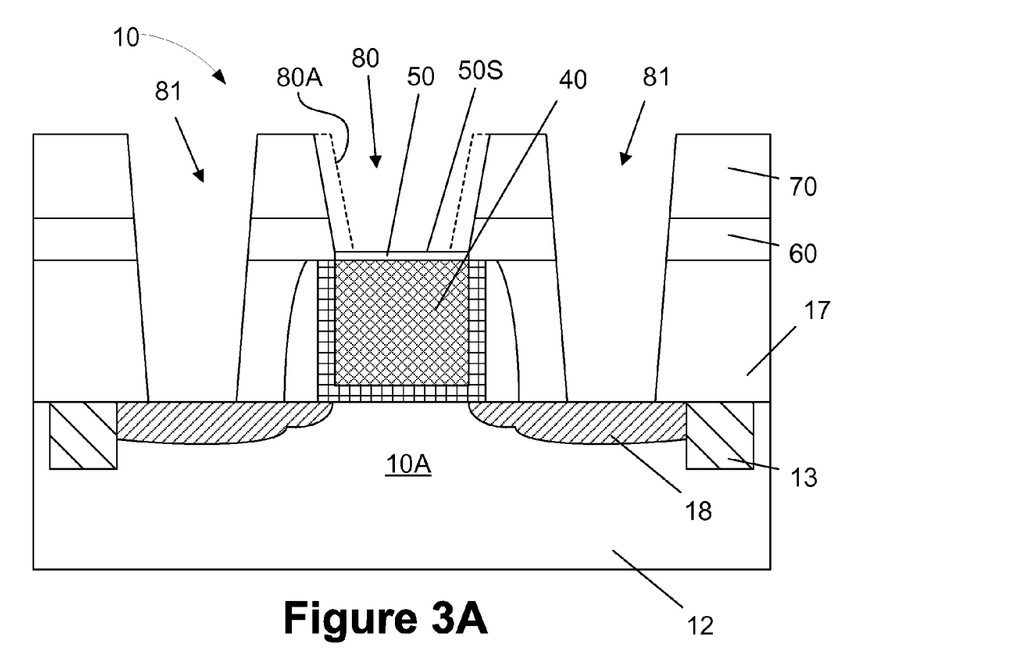
FIGS. 3A-3D depict another illustrative method of forming contact structures to a semiconductor device that includes a protective conductive cap in accordance with another exemplary embodiment of the present disclosure.
Figure 3B:
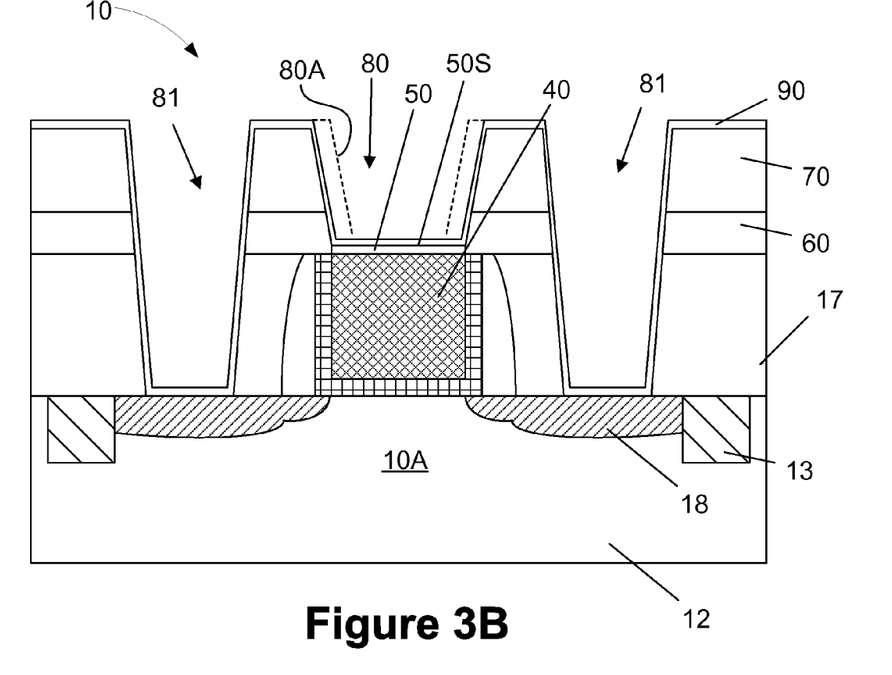
Figure 3C:
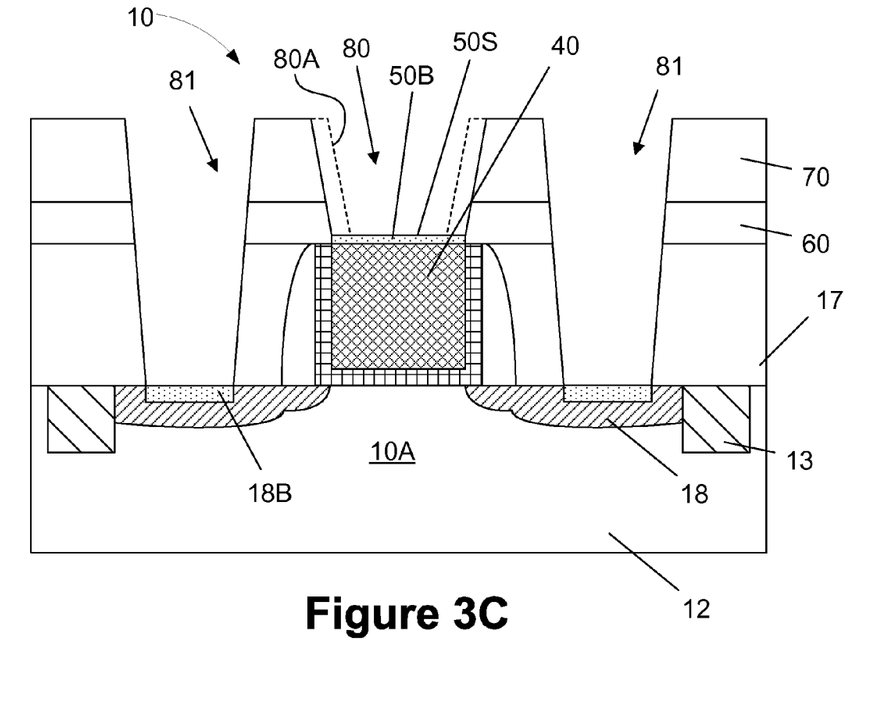
Figure 3D:
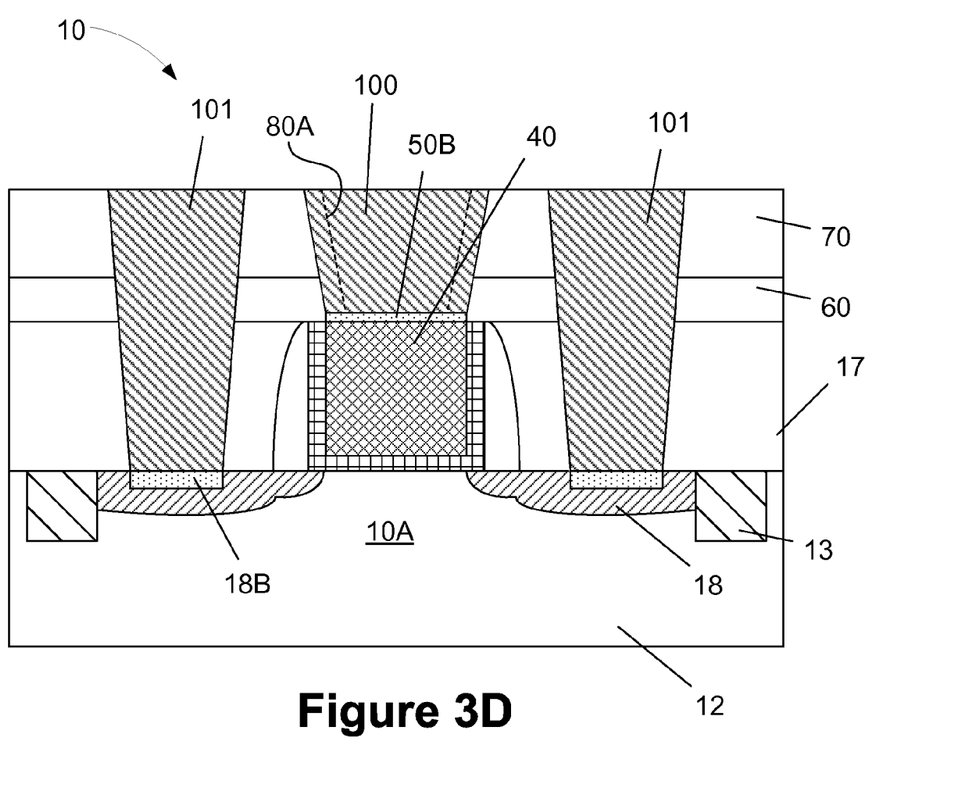

FIGS. 3A-3D depict an alternative exemplary method of forming contact elements to the various contact regions of the semiconductor device 10 shown in FIG. 2F and described above, and FIG. 3A illustrates the device 10 at the processing stage that corresponds to the processing stage illustrated in FIG. 2G. Furthermore, in the illustrative embodiments depicted in FIGS. 3A-3D, the conductive cap 50 is a silicon-containing semiconductor material. Additionally, as previously noted with respect to FIG. 2G above, while FIG. 3A shows that substantially the entire width of the conductive cap 50 may be exposed by the contact opening 80, the lateral size of the contact opening 80 may be adjusted (as indicated by the dashed lines 80A) so that only a portion of the conductive cap 50 may be exposed by the contact opening 80.

FIG. 3B illustrates the device 10 after one or more deposition processes have been performed so as to form a refractory metal layer 90 above the device 10 and into the contact openings 80, 81. The refractory metal layer 90 may include one or more refractory metals, such as nickel, titanium, cobalt, platinum and the like, either alone or in combination. After deposition of the refractory metal layer 90, one or more heat treatment processes may be performed to initiate a chemical reaction between the material (or materials) of the refractory metal layer 90 and the silicon-containing semiconductor material of the respective contact areas of the conductive cap 50 and the source/drain regions 18, thereby forming respective metal silicide regions 50B and 18B (see FIG. 3C).

In certain exemplary embodiments, the refractory metal layer 90 may be formed using a substantially conformal deposition process, such as an atomic layer deposition (ALD) process, a chemical vapor deposition (CVD) process and the like, so that the layer 90 may have a substantially uniform thickness along both the sidewall and bottom surfaces of the contact openings 80, 81. In other embodiments, the refractory metal layer 90 may be formed by using a substantially non-conformal deposition process, such as a physical vapor deposition (PVD) or sputter process and the like, so that the thickness of the layer 90 along the bottom surfaces of the contact openings 80, 81—i.e., in the areas where the silicide reaction process occurs—may be greater than the thickness of the layer 90 along the sidewalls of the openings 80, 81.

FIG. 3C illustrates the semiconductor device 10 of FIG. 3B after the one or more heat treatment processes have been performed and the silicide 50B has been formed in the conductive cap 50 and the silicides 18B have been formed in the source/drain regions 18 through the respective contact openings 80 and 81. Furthermore, in some embodiments, an etching process may be performed to remove any unreacted portions of the refractory metal layer 90, and any additional heat treatment process may also be performed to finalize the silicidation process, as may be required depending on the type of refractory metal used.

As noted with respect to FIG. 3A above, while the illustrative embodiment depicted in FIG. 3C shows that substantially the entire width of the conductive cap 50 has been converted to the silicide 50B, it should be understood that, in at least some embodiments, the silicide 50B may only extend across a portion of the width of the conductive cap 50. For example, in those embodiments wherein the lateral size of the contact opening 80 is adjusted as previously described (indicated by the dashed lines 80A in FIG. 3C) so that only a portion of the conductive cap 50 is exposed by the contact opening 80, then only the exposed portion of the conductive cap 50 may be subsequently covered by the refractory metal layer 90 and converted to the silicide 50B during the above-described one or more heat treatment processes.

FIG. 3D illustrates the device 10 after several further processing steps have been performed. For example, similar to the processing steps illustrated in FIG. 2H and described above, a conductive contact material for the contact structures 100 and 101 has been deposited in the respective contact openings 80 and 81 by performing one or more deposition processes. Furthermore, a planarization process, such as a CMP process and the like, has also been performed to planarize the contact structures 100, 101 and remove any excess conductive contact material that may have been formed outside of the contact openings 80, 81 and/or above the second insulating layer 70. In at least one embodiment, one or both of the contact structures 100, 101 may include tungsten, whereas, in other embodiments, at least one of the contact structures 100, 101 may include other conductive materials, such as cobalt, copper, silver and the like. Furthermore, the contact structures 100, 101 may have any desired shape, size or configuration, such as circular, square, rectangular, octagonal, and the like, depending upon the specific application.

As depicted in FIG. 3D, the contact structures 101 and 100 are electrically coupled to the respective silicide regions 18B, 50B, which are in turn electrically coupled to the underlying source/drain regions 18 and replacement gate electrode 40, respectively. In at least one embodiment, the contact structure 100 is formed above the replacement gate electrode 40 during a different material deposition sequence than when the contact structures 101 are formed above the source/drain regions 18, i.e., either before or after. Furthermore, in such embodiments, the contact structures 100 and 101 may contain either the same or different conductive materials. In other exemplary embodiments, the contact structures 100 and 101 may be formed during a common material deposition sequence, i.e., at the same time, from the same conductive material or materials.

Referring to FIGS. 2A-2H and 3A-3D, the protective conductive cap 50 (and/or silicide portion 50B) formed above the replacement gate electrode 40 is adapted to protect the material of the replacement gate electrode 40, e.g. aluminum, from being attacked by the contact material, e.g. tungsten, as illustrated in FIGS. 1A-1B. In particular, the conductive cap 50 (and/or silicide 50B) is adapted to prevent the conductive contact material of the contact structure 100 from entering and/or partially filling the replacement gate electrode region. In this way, the likelihood of undesirable shift in the threshold voltage ($V_t$) of the device 10 may be substantially reduced or even prevented.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a replacement gate structure comprising an HK/MG material layer stack and a conductive metal gate electrode in a gate cavity, wherein said gate cavity is formed in a dielectric material formed above an active region of a semiconductor device, and wherein said HK/MG material layer stack is formed between said conductive metal gate electrode and sidewall and bottom surfaces of said gate cavity, said HK/MG material layer stack comprising a high-k dielectric material and a work function metal material formed above said high-k dielectric material;
    planarizing an upper surface of said conductive metal gate electrode, an upper surface of said HK/MG material layer stack, and an upper surface of said dielectric material during a common planarization process;
    selectively forming a protective conductive cap on and in direct physical contact with said planarized upper surface of said conductive metal gate electrode, wherein said protective conductive cap is substantially confined to said planarized upper surface of said conductive metal gate electrode and is not formed on and in direct physical contact with planarized upper surface portions of said high-k dielectric material or said work function metal material of said HK/MG material layer stack; and forming a contact structure in a dielectric insulating layer formed above said replacement gate structure, said contact structure directly contacting said protective conductive cap.

2. The method of claim 1, wherein selectively forming said protective conductive cap comprises performing a selective growth process, wherein said planarized upper surfaces of said conductive metal gate electrode, said HK/MG material layer stack, and said dielectric material are exposed to said selective growth process, and wherein performing said selective growth process comprises initiating growth of a material comprising said protective conductive cap on said material of said conductive metal gate electrode but not on said dielectric material or said materials comprising said HK/MG material layer stack.

3. The method of claim 2, wherein performing said selective growth process comprises performing a pregrowth anneal process above approximately 577° C.

4. The method of claim 3, wherein said pregrowth anneal process is performed under substantial vacuum conditions having a pressure of approximately $1 \times 10^{-6}$ Torr or lower.

5. The method of claim 1, wherein said selectively formed protective conductive cap covers an entirety of said planarized upper surface of said conductive metal gate electrode but does not cover said planarized upper surface of said dielectric material.

6. The method of claim 1, wherein said conductive metal gate electrode comprises aluminum.

7. The method of claim 6, wherein said protective conductive cap comprises silicon.

8. The method of claim 1, further comprising performing a silicidation process on said protective conductive cap.

9. The method of claim 1, wherein said selectively formed protective conductive cap covers an entirety of said planarized upper surface of said conductive metal gate electrode but does not cover an entirety of said planarized upper surface of said HK/MG material layer stack or said planarized upper surface of said dielectric material.

10. The method of claim 1, wherein an upper surface of said protective conductive cap is at a greater height level above said active region than said planarized upper surface of said portion of said material layer stack and said planarized upper surface of said dielectric material.

11. The method of claim 1, wherein selectively forming said protective conductive cap comprises performing a selective deposition process, and wherein said planarized upper surfaces of said conductive metal gate electrode, said HK/MG material layer stack, and said dielectric material are exposed to said selective deposition process.

12. The method of claim 11, wherein performing said selective deposition process comprises performing a vapor phase deposition process.

13. The method of claim 1, wherein said protective conductive cap comprises one of tungsten, rhenium, ruthenium, rhodium, palladium, silver, osmium, iridium, platinum and gold.

14. The method of claim 1, wherein said work function metal material is a first work function metal material, wherein said HK/MG material layer stack further comprises a second work function metal material positioned above said first work function metal material, and wherein said protective conductive cap is not formed on and in direct physical contact with a planarized upper surface portion of said second work function metal material.

15. A method, comprising:
lining sidewall and bottom surfaces of a gate cavity with a material layer stack comprising a high-k dielectric material and a work function metal formed above said high-k dielectric material, wherein said gate cavity is formed in a dielectric material formed above an active region of a semiconductor device;
forming a conductive gate electrode material comprising aluminum in said gate cavity and above said material layer stack;
performing a planarization process on said conductive gate electrode material, said material layer stack, and said dielectric material so as to form a replacement gate structure comprising an aluminum gate electrode and an HK/MG material layer stack in said gate cavity, said HK/MG material layer stack comprising a planarized layer portion of said high-k dielectric material and a planarized layer portion of said work function metal;
selectively forming a protective conductive cap on and in direct physical contact with a planarized upper surface of said aluminum gate electrode but not on and in direct physical contact with planarized upper surfaces of said planarized layer portions of said high-k dielectric material or said work function metal of said HK/MG material layer stack, an upper surface of said protective conductive cap being at a greater height level above said active region than said planarized upper surfaces of said planarized layer portions of said high-k dielectric material and said work function metal of said HK/MG material layer stack and a planarized upper surface of said dielectric material; and
forming a contact structure in a dielectric insulating layer formed above said replacement gate structure, said contact structure directly contacting said protective conductive cap and said protective conductive cap physically separating said contact structure from said aluminum gate electrode.

16. The method of claim 15, wherein selectively forming said protective conductive cap comprises performing a selective growth process, wherein said planarized upper surfaces of said aluminum gate electrode, said planarized layer portions of said high-k dielectric material and said work function metal of said HK/MG material layer stack and said dielectric material are exposed to said selective growth process, and wherein performing said selective growth process comprises initiating growth of a material comprising said protective conductive cap on said exposed planarized upper surface of said aluminum gate electrode but not on said exposed planarized upper surfaces of said planarized layer portions of said high-k dielectric material or said work function metal of said HK/MG material layer stack or said exposed planarized upper surface of said dielectric material.

17. The method of claim 15, wherein said selectively formed protective conductive cap covers an entirety of said planarized upper surface of said aluminum gate electrode but does not cover an entirety of said planarized upper surfaces of said planarized layer portions of said high-k dielectric material or said work function metal of HK/MG material layer stack or said planarized upper surface of said dielectric material.

18. The method of claim 15, wherein said planarized upper surface of said aluminum gate electrode is substantially coplanar with adjacent planarized upper surfaces of said HK/MG material layer stack and said dielectric material.

19. The method of claim 15, wherein said protective conductive cap comprises silicon.

20. The method of claim 19, further comprising forming a metal silicide in said protective conductive cap prior to forming said contact structure.

21. The method of claim 15, wherein selectively forming said protective conductive cap comprises performing a selective deposition process, wherein said planarized upper surfaces of said HK/MG material layer stack and said dielectric material are exposed to said selective deposition process, and wherein performing said selective deposition process comprises forming said protective conductive cap on said exposed planarized upper surface of said aluminum gate electrode but not on said exposed planarized upper surface of said dielectric material.

22. The method of claim 21, wherein performing said selective deposition process comprises performing a self-limiting atomic layer deposition process.

23. The method of claim 15, wherein said protective conductive cap comprises one of tungsten, rhenium, ruthenium, rhodium, palladium, silver, osmium, iridium, platinum and gold.

24. A device, comprising:
- a metal gate structure positioned above an active region of a semiconductor substrate, said metal gate structure comprising an HK/MG material layer stack and a conductive metal gate electrode positioned above said HK/MG material layer stack, wherein said HK/MG material layer stack comprises a high-k dielectric material layer and at least one work function metal layer positioned above said high-k dielectric material layer;
- a first dielectric material positioned adjacent to and surrounding said metal gate structure, wherein upper surfaces of said conductive metal gate electrode, said high-k dielectric material layer, said at least one work function metal layer, and said first dielectric material are substantially coplanar;
- a protective conductive cap positioned on and in direct physical contact with said upper surface of said conductive metal gate electrode, wherein an upper surface of said protective conductive cap is at a greater height level above said active region than said upper surface of said first dielectric material, and wherein said protective conductive cap is substantially confined to and covers an entirety of said upper surface of said conductive metal gate electrode but does not cover an entirety of said upper surface of said at least one work function metal layer, any of said upper surface of said high-k dielectric material layer, or any of said upper surface of said first dielectric material;
- a second dielectric material covering said metal gate structure and said first dielectric material; and
- a contact structure positioned in said second dielectric material, said contact structure directly contacting said protective conductive cap, said protective conductive cap physically separating said contact structure from said conductive metal gate electrode.

25. The device of claim 24, wherein said protective conductive cap comprises one of silicon, tungsten, rhenium, ruthenium, rhodium, palladium, silver, osmium, iridium, platinum and gold.

* * * * *